(12) United States Patent
Niwa

(10) Patent No.: US 11,482,502 B2
(45) Date of Patent: Oct. 25, 2022

(54) SEMICONDUCTOR DEVICE AND SEMICONDUCTOR DEVICE MANUFACTURING METHOD

(71) Applicant: KIOXIA CORPORATION, Tokyo (JP)

(72) Inventor: Keiichi Niwa, Yokkaichi Mie (JP)

(73) Assignee: KIOXIA CORPORATION, Tokyo (JP)

( * ) Notice: Subject to any disclaimer, the term of this patent is extended or adjusted under 35 U.S.C. 154(b) by 8 days.

(21) Appl. No.: 17/008,513

(22) Filed: Aug. 31, 2020

(65) Prior Publication Data
US 2021/0249373 A1 Aug. 12, 2021

(30) Foreign Application Priority Data
Feb. 7, 2020 (JP) .............................. JP2020-019933

(51) Int. Cl.
| | |
|---|---|
| *H01L 23/00* | (2006.01) |
| *H01L 21/48* | (2006.01) |
| *H01L 25/065* | (2006.01) |
| *H01L 23/31* | (2006.01) |
| *H01L 23/498* | (2006.01) |
| *H01L 21/56* | (2006.01) |

(52) U.S. Cl.
CPC .......... *H01L 24/16* (2013.01); *H01L 21/4853* (2013.01); *H01L 21/563* (2013.01); *H01L 23/3185* (2013.01); *H01L 23/49838* (2013.01); *H01L 25/0657* (2013.01); *H01L 2224/16238* (2013.01); *H01L 2225/0651* (2013.01); *H01L 2225/06506* (2013.01); *H01L 2225/06517* (2013.01); *H01L 2225/06562* (2013.01); *H01L 2225/06575* (2013.01); *H01L 2225/06586* (2013.01); *H01L 2924/18161* (2013.01)

(58) Field of Classification Search
CPC .... H01L 24/16; H01L 21/4853; H01L 21/563
See application file for complete search history.

(56) References Cited

U.S. PATENT DOCUMENTS

| | | | | |
|---|---|---|---|---|
| 4,818,728 | A * | 4/1989 | Rai | H01L 24/13 257/781 |
| 5,640,052 | A * | 6/1997 | Tsukamoto | H01L 24/13 257/781 |
| 6,028,357 | A * | 2/2000 | Moriyama | H01L 23/24 257/737 |

(Continued)

FOREIGN PATENT DOCUMENTS

| | | |
|---|---|---|
| JP | 2014-123592 A | 7/2014 |
| JP | 2016-529241 A | 9/2016 |
| JP | 6220799 B2 | 10/2017 |

*Primary Examiner* — Nicholas J Tobergte
(74) *Attorney, Agent, or Firm* — Kim & Stewart LLP

(57) ABSTRACT

A semiconductor device includes a substrate that includes a first insulating layer, a conductive layer on the first insulating layer, a second insulating layer on the conductive layer, and an opening that passes through the conductive layer and the second insulating layer and in which part of the conductive layer is exposed, a conductive material that contacts at least the first insulating layer and the part of the conductive layer in the opening, and a semiconductor chip that has an electrode extending towards the first insulating layer within the opening and contacting the conductive material.

19 Claims, 16 Drawing Sheets

(56) References Cited

U.S. PATENT DOCUMENTS

| | | | | |
|---|---|---|---|---|
| 6,956,293 B2* | 10/2005 | Takaike | ................ | H01L 24/03 |
| | | | | 257/781 |
| 7,696,623 B2 | 4/2010 | Tsai et al. | | |
| 10,014,248 B2 | 7/2018 | Murai et al. | | |
| 2005/0218502 A1* | 10/2005 | Sunohara | ................ | H01L 23/50 |
| | | | | 257/E23.079 |
| 2009/0020882 A1* | 1/2009 | Hasegawa | ......... | H01L 23/49827 |
| | | | | 257/773 |
| 2009/0294978 A1 | 12/2009 | Ota et al. | | |
| 2012/0119377 A1* | 5/2012 | Muramatsu | ....... | H01L 23/49822 |
| | | | | 257/E21.585 |
| 2014/0183744 A1* | 7/2014 | Lee | ................ | H01L 23/49894 |
| | | | | 257/762 |

\* cited by examiner

SEMICONDUCTOR DEVICE AND SEMICONDUCTOR DEVICE MANUFACTURING METHOD

This application is based upon and claims the benefit of priority from Japanese Patent Application No. 2020-019933, filed Feb. 7, 2020, the entire contents of which are incorporated herein by reference.

FIELD

Embodiments described herein relate generally to a semiconductor device and a semiconductor device manufacturing method.

BACKGROUND

As a method of flip-chip bonding for connecting a semiconductor chip to an interconnection board, a mass reflow approach and a thermo-compression bonding approach are known. In the flip-chip bonding based on the thermo-compression bonding, when the semiconductor chip is mounted on the interconnection board, a solder is melted by heat, and bumps on the semiconductor chip are connected to pads of the interconnection board by thermo-compression bonding.

The interconnection board used in such a thermocompression bonding approach has an opening in a solder resist in each bump connection region, and part of an interconnection or the pads are exposed within the openings. Thus, in this connection region, a level (height) difference is present between the solder resist and the substrate (e.g., prepreg) on which the solder resist is disposed. As a result, voids often remain within the connection region or around each bump at a time of supplying an NCP (Non-Conductive Paste). Such voids disadvantageously cause a short circuit failure between adjacent bumps, poor adhesiveness of the NCP resin, or a deterioration in reliability.

DETAILED DESCRIPTION

Embodiments provide a semiconductor device and a semiconductor device manufacturing method capable of preventing generation of voids in a connection region during flip-chip bonding.

In general, according to one embodiment, a semiconductor device includes a substrate that includes a first insulating layer, a conductive layer on the first insulating layer, and a second insulating layer on the conductive layer. The substrate further includes an opening that passes through the conductive layer and the second insulating layer and in which part of the conductive layer is exposed. The semiconductor device includes a conductive material that contacts at least the first insulating layer and the part of the conductive layer in the opening. The semiconductor device further includes a semiconductor chip that has an electrode extending towards the first insulating layer within the opening and contacting the conductive material.

Certain example embodiments according to the present disclosure will be described hereinafter with reference to the drawings. The example embodiments are not intended to limit the present disclosure. In the following, a vertical direction of an interconnection board or a substrate indicates a relative direction when a surface of the interconnection board on which semiconductor chips are mounted is an upper surface, and the vertical direction sometimes differs from a direction of the acceleration of gravity. The drawings are either schematic or conceptual and dimensional ratios of elements and the like are not necessarily identical to actual ones. In the specification and the drawings, similar elements to those already described with reference to previous drawings are denoted by the same reference signs, and detailed description thereof is omitted as appropriate.

First Embodiment

Figure 1:
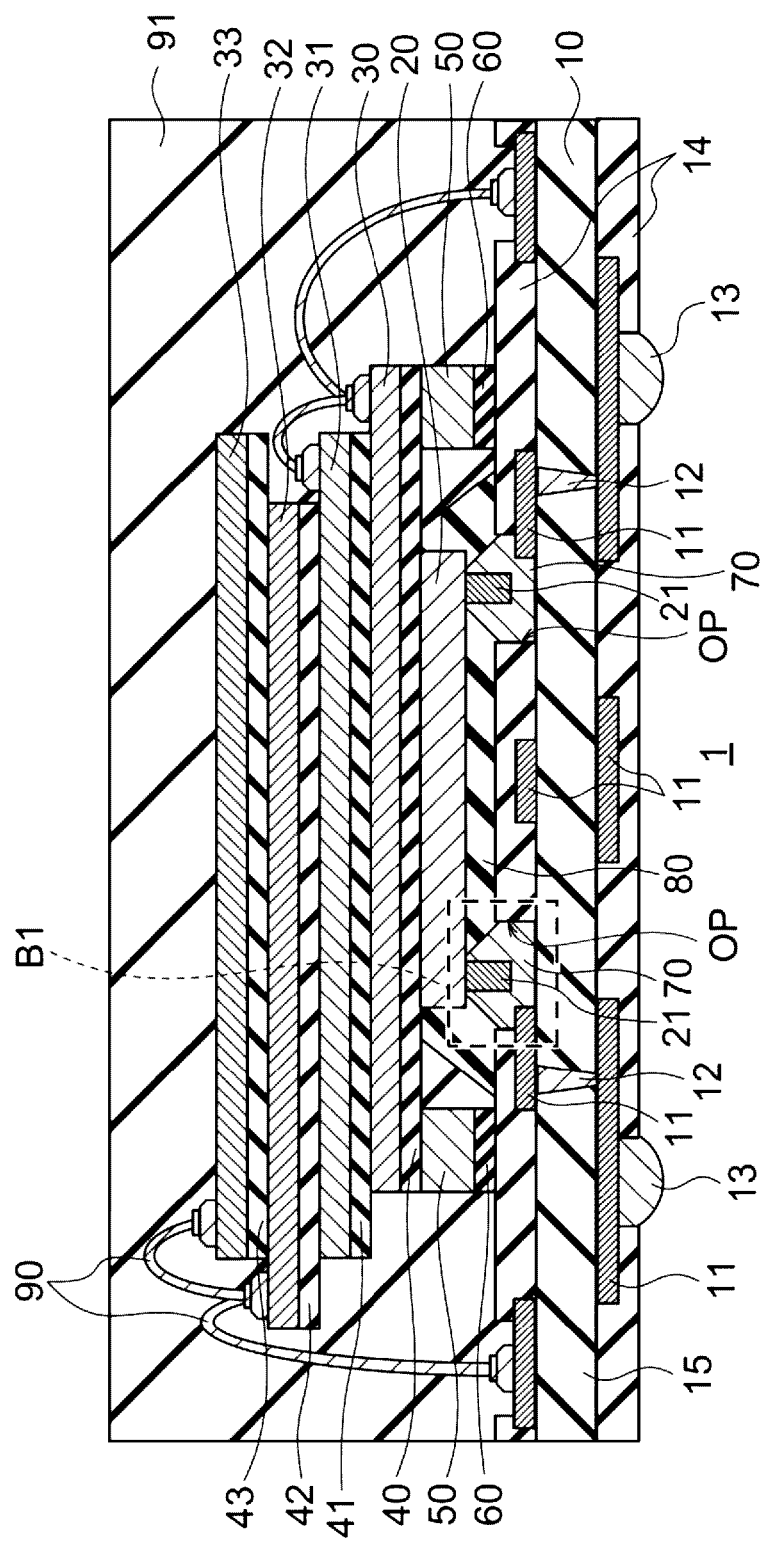
FIG. 1 is a cross-sectional view of a semiconductor device according to a first embodiment.

FIG. 1 is a cross-sectional view of a semiconductor device according 1 according to a first embodiment. The semiconductor device 1 includes an interconnection board 10 (also referred to as a substrate in some contexts), semiconductor chips 20, 30, 31, 31, and 33, adhesive layers 40, 41, 42, and 43, a spacer chip 50, an adhesive layer 60, a metal material 70, a resin layer 80, a bonding wire 90, and an encapsulation resin 91. The semiconductor device 1 is, for example, a NAND flash memory package.

The interconnection board 10 may be a printed circuit board or an interposer including interconnection layers 11 (which may be referred to as conductive layers in some contexts) and an insulating layer 15. For example, a low resistance metal, such as copper, nickel, or an alloy thereof, is used for the interconnection layers 11. For example, an insulating material such as a glass epoxy resin is used for the insulating layer 15. In FIG. 1, the interconnection layers 11 are provided only on a front surface and a rear surface of the insulating layer 15. However, the interconnection board 10 may have a multilayer interconnection structure in which a plurality of interconnection layers 11 and a plurality of insulating layers 15 are stacked. The interconnection board 10 may have through vias 12 passing through the interconnection board 10 like, for example, an interposer.

A solder resist layer 14 is provided on the front surface of the interconnection board 10 and the interconnection layer 11. The solder resist layer 14 is an insulating layer for protecting the interconnection layer 11 from the metal material 70 and preventing a short circuit failure. Openings OP are provided in the solder resist layer 14. A part of the interconnection layer 11 and the insulating layer 15 are exposed in each opening OP.

The solder resist layer 14 is also provided on the rear surface of the interconnection board 10. Metal bumps 13 are provided on the interconnection layer 11 exposed from the solder resist layer 14. The metal bumps 13 are provided for electrically connecting other components to the interconnection board 10.

The semiconductor chip 20 is, for example, a controller chip that controls a memory chip. Semiconductor elements, not shown, are provided on a front surface of the semiconductor chip 20. The semiconductor elements may be, for example, CMOS (Complementary Metal Oxide Semiconductor) circuits that configures controller. Electrode pillars 21 electrically connected to the semiconductor elements are provided on a rear surface of the semiconductor chip 20. For example, a low resistance metal, such as copper, nickel, or an alloy thereof, is used for the electrode pillars 21.

Each electrode pillar 21 is inserted into each opening OP of the interconnection board 10, and a lower end portion of the electrode pillar 21 is disposed at a lower position than a position of an upper end of the opening OP. The metal material 70 is provided around the electrode pillar 21. The electrode pillar 21 is electrically connected to the interconnection layer 11 exposed in the opening OP via the metal material 70.

The metal material 70 is filled in each opening OP of the interconnection board 10, and covers the interconnection layer 11 exposed within the opening OP. For example, a low resistance metal, such as a solder, silver, and copper, is used for the metal material 70. As described later, the metal material 70 is supplied as a liquid or paste metal material and then formed by being cured. The metal material covers the interconnection layer 11 of the interconnection board 10 within each opening OP and also covers a side surface of each electrode pillar 21 of the semiconductor chip 20. The metal material 70 can thereby electrically connect the electrode pillar 21 of the semiconductor chip 20 to the interconnection layer 11 of the interconnection board 10. The electrode pillar 21 is apart from the interconnection layer 11 and not in direct contact with the interconnection layer 11. That is, the metal material 70 is interposed between the electrode pillar 21 and the interconnection layer 11.

A resin layer 80 (also referred to as underfill resin in some contexts) is provided around the semiconductor chip and between the semiconductor chip 20 and the interconnection board 10. The resin layer 80 is formed by, for example, curing an NCP (Non-Conductive Paste), and covers surroundings of the semiconductor chip 20 to protect the semiconductor chip 20.

The semiconductor chip 30 is adhesively bonded onto the semiconductor chip 20 via the adhesive layer 40. The semiconductor chip 30 is, for example, a memory chip including a NAND flash memory. The semiconductor chip 30 has semiconductor elements on a front surface thereof. The semiconductor elements may be, for example, a memory cell array and a peripheral circuit (CMOS circuit) around the memory cell array. The memory cell array may be a three-dimensional memory cell array on which a plurality of memory cells are arranged three-dimensionally. Furthermore, the semiconductor chip 31 is adhesively bonded onto the semiconductor chip 30 via the adhesive layer 41. The semiconductor chip 32 is adhesively bonded onto the semiconductor chip 31 via the adhesive layer 42. The semiconductor chip 33 is adhesively bonded onto the semiconductor chip 32 via the adhesive layer 43. The semiconductor chips 31 to 33 are each, for example, a memory chip including a NAND flash memory similarly to, for example, the semiconductor chip 30. The semiconductor chips 30 to may be identical memory chips. In FIG. 1, the semiconductor chips 30 to 33 are stacked as four memory chips above the semiconductor chip 20 serving as the controller chip. Nevertheless, the number of stacked layers of the semiconductor chips may be equal to or smaller than 3 or may be equal to or greater than 5.

The semiconductor chip 30 is larger than the semiconductor chip 20, and an outer edge of the semiconductor chip 30 is on outside of an outer edge of the semiconductor chip 20 when viewed above. The spacer chips 50 are provided between the semiconductor chip 30 and the solder resist layer 14 of the interconnection board 10 around the semiconductor chip 20. The spacer chips 50 are adhesively bonded onto the solder resist layer 14 via the adhesive layers 60. Furthermore, the adhesive layer 40 is adhesively bonded onto upper surfaces of the spacer chips 50, and the semiconductor chip 30 is adhesively bonded onto the upper surfaces of the spacer chips 50 via the adhesive layer 40.

The bonding wire 90 connects pads of the interconnection board 10 and the semiconductor chips 30 to 33. For connecting the semiconductor chips 30 to 33 by the bonding wire 90, the semiconductor chips 30 to 33 are stacked and arranged staggered (offset) from each other by the size of the pad. It is noted that the semiconductor chip 20 is not connected to the bonding wire 90 by wire bonding since the semiconductor chip 20 is flip-chip bonded by the electrode pillars 21. Nevertheless, in other examples, the semiconductor chip 20 may be not only flip-chip bonded by the electrode pillars 21 but also wire bonded.

The encapsulation resin 91 encapsulates the semiconductor chips 20 and 30 to 33, the spacer chips 50, the resin layer 80, the bonding wire 90, and the like. In the semiconductor device 1, the plurality of semiconductor chips 20 and 30 to 33 thereby form one semiconductor package on the interconnection board 10.

Figure 2:
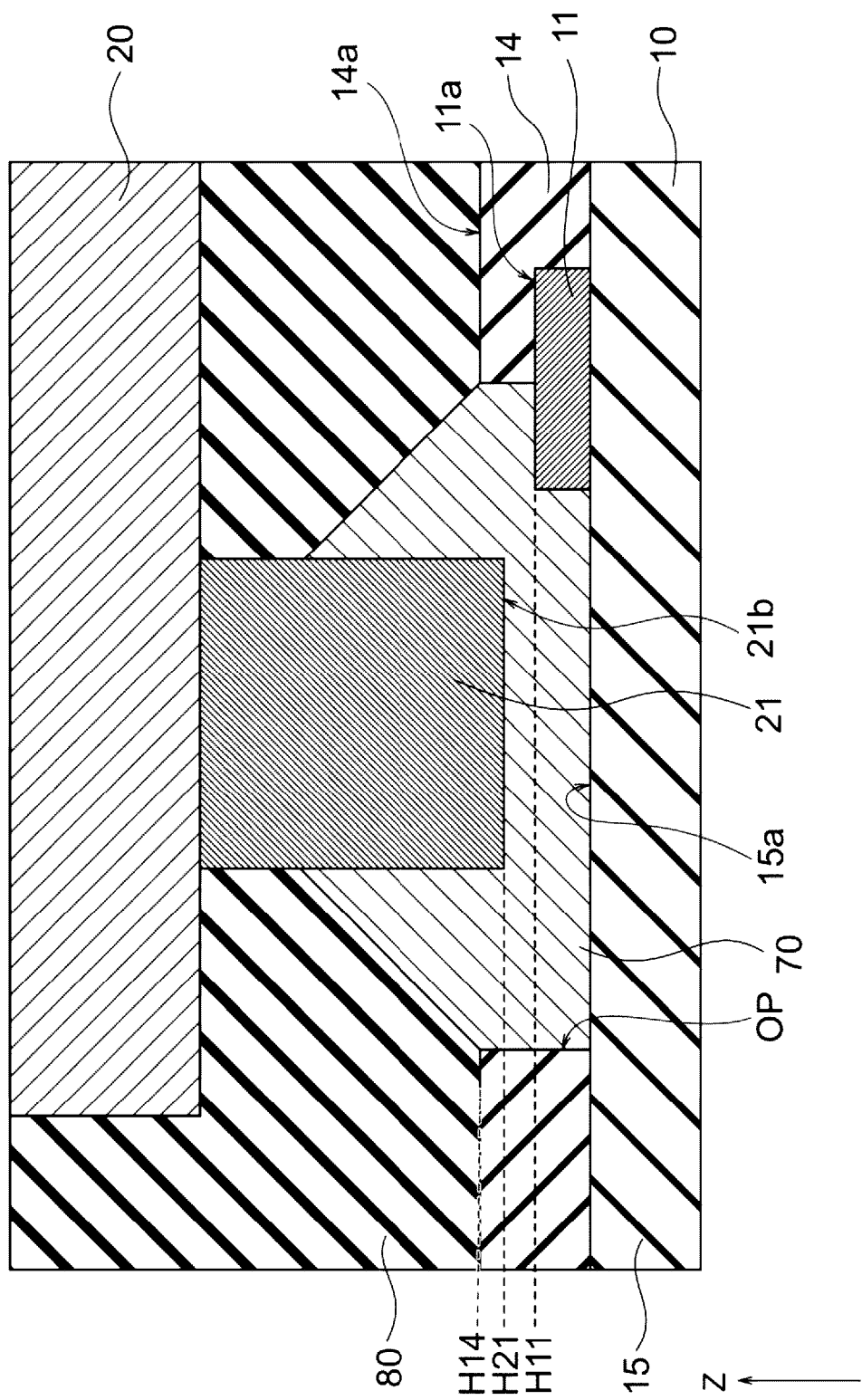
FIG. 2 is an enlarged cross-sectional view of a frame B1 shown in FIG. 1.
Figure 3:
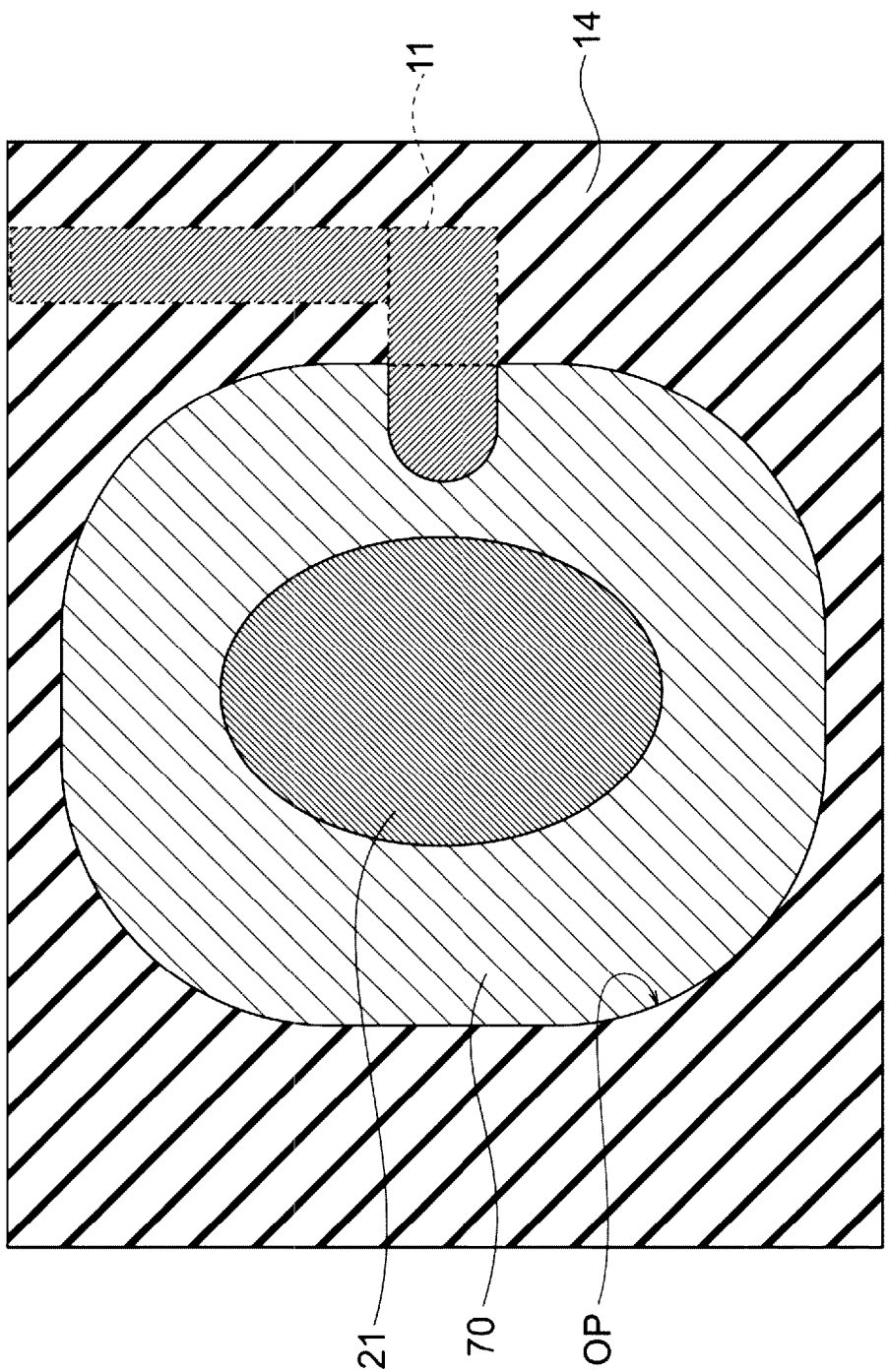
FIG. 3 is a plan view showing a positional relationship among a solder resist layer, an opening, an interconnection layer, and an electrode pillar.

FIG. 2 is an enlarged cross-sectional view of a frame B1 shown in FIG. 1. FIG. 3 is a plan view showing a positional relationship among the solder resist layer 14, the opening OP, the interconnection layer 11, and the electrode pillar 21. The openings OP are provided in the solder resist layer 14, and part of the interconnection layer 11 is exposed in each opening OP. The metal material 70 is filled in the opening OP and is in contact with the part of the interconnection layer 11. Each electrode pillar 21 is inserted into the metal material 70 and electrically connected to the interconnection layer 11 via the metal material 70.

A lower end portion 21b of each electrode pillar 21 is inserted into each opening OP. Therefore, a height H21 of the lower end portion 21b of the electrode pillar 21 from the upper surface 15a of the insulating layer 15 is smaller than a height H14 of an upper surface 14a of the solder resist layer 14 from the upper surface 15a. The electrode pillar 21 is thereby brought into contact with and inserted into the liquid or paste metal material 70 filled in the opening OP. The metal material 70 is brought up from the lower end portion 21b of the electrode pillar 21 along a side surface thereof, and tapered obliquely upward from an upper end of the opening OP to the side surface of the electrode pillar 21. In this way, the metal material 70 bulges from the opening OP along the side surface of the electrode pillar 21. The metal material 70 bulges from the opening OP along the side surface of the electrode pillar 21 by as much as a volume equal to or greater than a volume of the electrode pillar 21 inserted into the opening OP. The bulge of the metal material 70 from the opening OP in such a manner as to be in contact with the side surface of the electrode pillar 21 enables a reduction in a contact resistance between the metal material 70 and the electrode pillar 21.

In FIG. 2, the height H21 of the lower end portion 21b of the electrode pillar 21 is smaller than the height H14 of the solder resist layer 14 and greater than a height H11 of an upper surface 11a of the interconnection layer 11. However, the height H21 of the lower end portion 21b of the electrode pillar 21 may be smaller than the height H11 of the upper surface 11a of the interconnection layer 11. Furthermore, the lower end portion 21b of the electrode pillar 21 may be in contact with the upper surface 15a of the insulating layer 15 of the interconnection board 10. Since the interconnection layer 11 is not provided immediately under the electrode pillar 21, the lower end portion 21b of the electrode pillar 21 can contact the upper surface 15a of the insulating layer 15. That is, the height H21 of the lower end portion 21b may be set equal to a height of the upper surface 15a of the insulating layer 15. In this way, the lower end portion 21b of the electrode pillar 21 may be located at any position lower than the height H14 of the solder resist layer 14. As the lower end portion 21b of the electrode pillar 21 is closer to the upper surface 15a of the insulating layer 15, the semiconductor chip 20 can be made closer to the interconnection board 10, and the package of the semiconductor device 1 can be made thinner. Therefore, the lower end portion 21b of the electrode pillar 21 is preferably closer to the upper surface 15a of the insulating layer 15.

Moreover, the interconnection layer 11 is not present immediately under each electrode pillar 21. As shown in FIG. 3, in a view from a mounting direction of the semiconductor chip 20 (that is, from above in the Z direction of FIG. 2), the electrode pillar 21 is apart from the interconnection layer 11, and the metal material 70 (as "conductive material") is interposed between the electrode pillar 21 and the interconnection layer 11.

In the view from the mounting direction, part of the interconnection layer 11 projects from a side surface of each opening OP toward a central portion thereof. This increases a contact area between the interconnection layer and the metal material 70 and reduces the contact resistance between the interconnection layer 11 and the metal material 70.

For example, the liquid or paste metal material 70, such as solder paste, copper or silver paste, or copper or silver nano ink, is filled into each opening OP in advance, and each electrode pillar 21 of the semiconductor chip 20 is inserted (or immersed) into the metal material 70 within the opening OP. It is thereby possible to prevent generation of voids within the opening OP and prevent poor contact between the electrode pillar 21 and the interconnection layer 11.

Furthermore, in a planar layout, each electrode pillar does not overlap the interconnection layer 11 and is apart from the interconnection layer 11. That is, in the planar layout, the electrode pillar 21 does not interfere with the interconnection layer 11. It is thereby possible to set the height H21 of the lower end portion 21b of the electrode pillar 21 to be smaller than the height H11 of the upper surface 11a of the interconnection layer 11. Furthermore, the lower end portion 21b of the electrode pillar 21 may reach the upper surface 15a of the insulating layer 15. By making the lower end portion 21b of the electrode pillar 21 closer to the upper surface 15a of the insulating layer 15, it is possible to make thinner the package of the semiconductor device 1.

A method of manufacturing the semiconductor device 1 will next be described.

Figure 4:
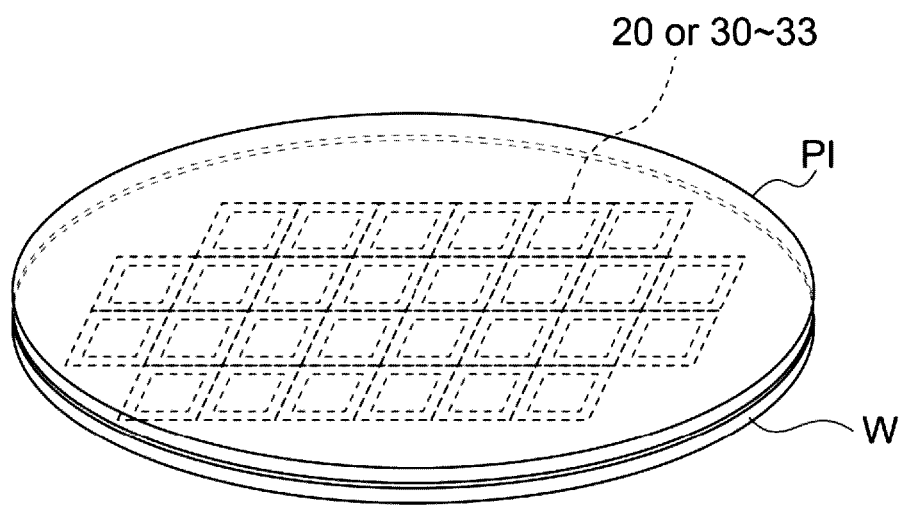
FIG. 4-15 depict aspects of a semiconductor device manufacturing method according to a first embodiment.

FIGS. 4 to 15 show an example of the semiconductor device manufacturing method. First, semiconductor elements are formed on a semiconductor wafer W. FIG. 4 is a perspective view of the semiconductor wafer W on which the semiconductor elements are formed. The semiconductor elements are formed on the semiconductor wafer W and covered with polyimide PI. The semiconductor wafer W includes a plurality of semiconductor chips 20 (or 30 to 33) to be diced in a dicing process to be described later.

Figure 5:
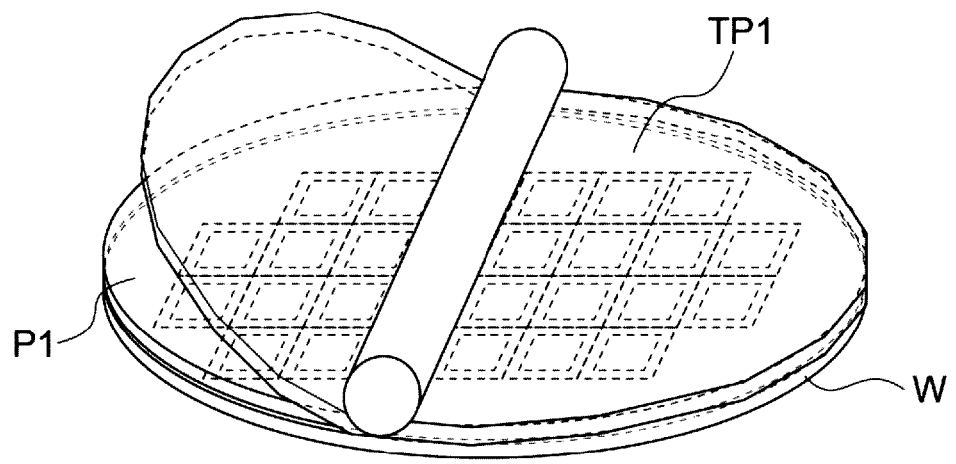
Figure 6:
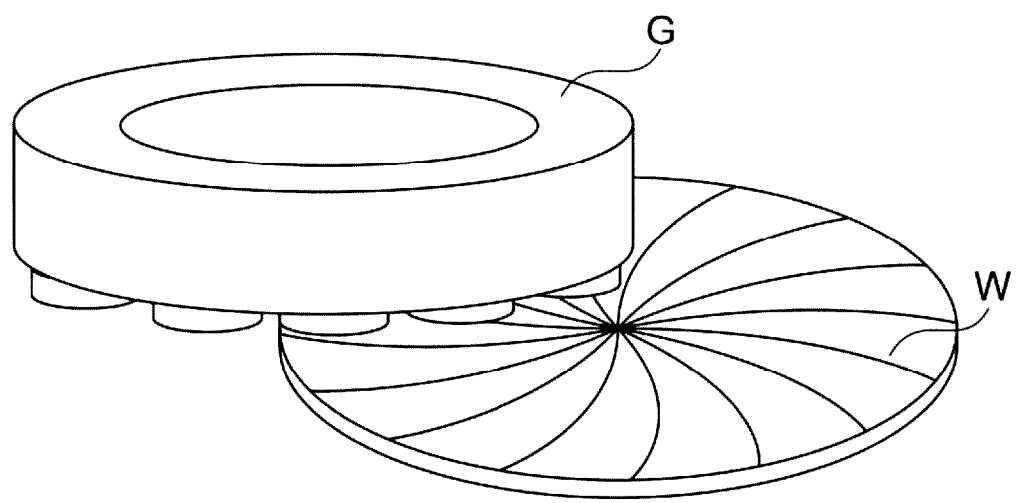

Next, as shown in FIG. 5, a protective tape TP1 is attached onto the polyimide PI. Next, as shown in FIG. 6, a rear surface of the semiconductor wafer W is polished by a grinder G with the protective tape TP1 placed below.

Figure 7:
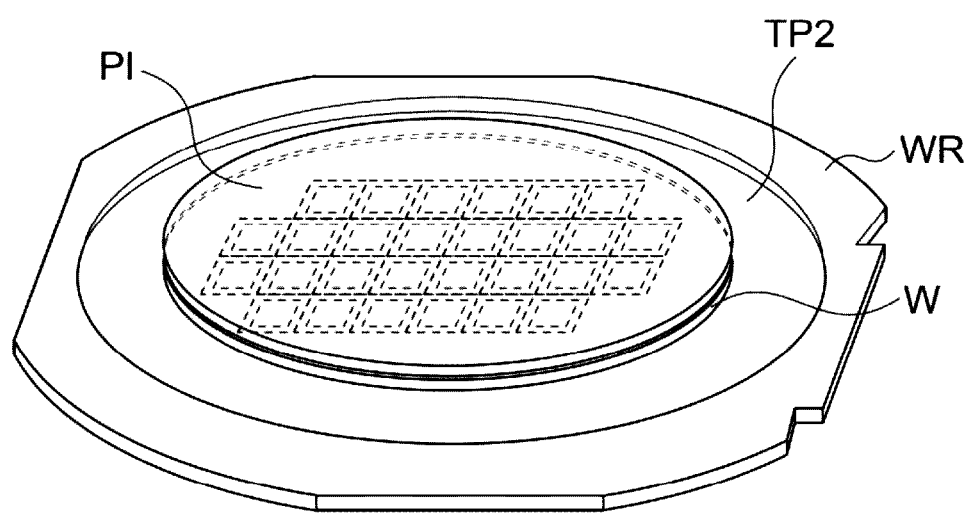
Figure 8:
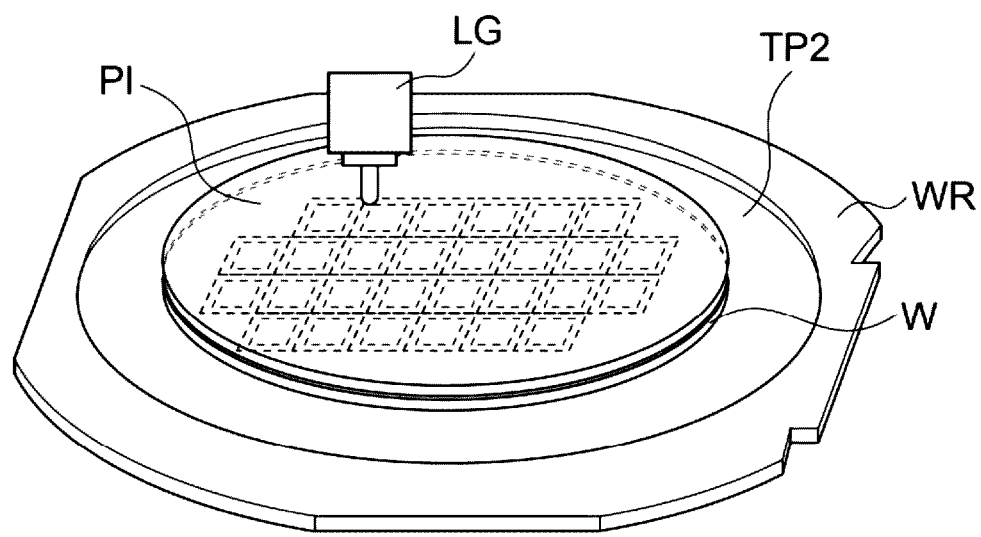

After peeling off the protective tape TP1, as shown in FIG. 7, the rear surface of the semiconductor wafer W is attached to a flexible resin tape TP2 stretched within a wafer ring WR. Next, as shown in FIG. 8, a laser beam is radiated from a laser oscillator LG along dicing lines on the front surface or rear surface of the semiconductor wafer W. Grooves are thereby formed along the dicing lines.

Figure 9:
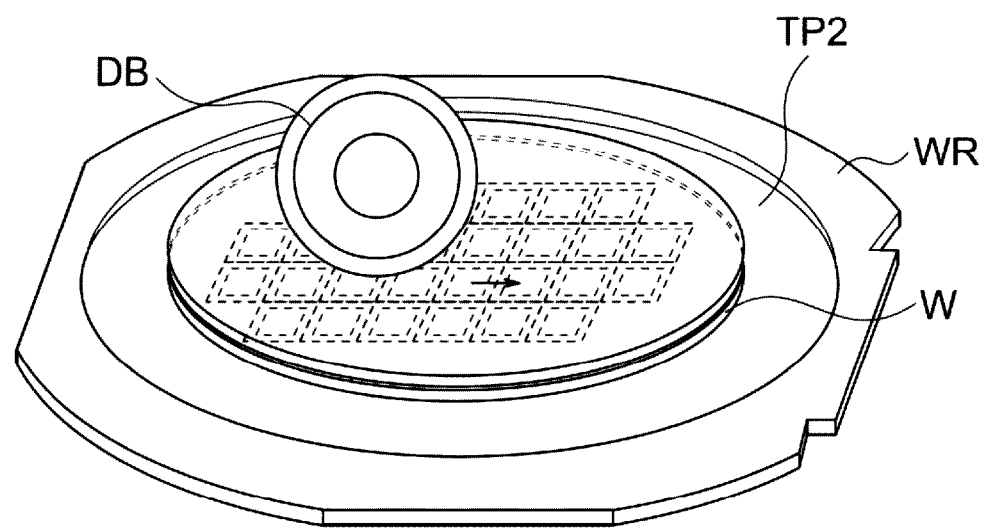

Next, as shown in FIG. 9, the semiconductor wafer W is cut by a dicing blade DB along the grooves in the dicing lines. The semiconductor wafer W is thereby diced into the semiconductor chips 20 (or 30 to 33). The diced semiconductor chips 20 (or 30 to 33) are each picked up from the resin tape TP2 to be mounted on the interconnection board 10.

On the other hand, the insulating layer 15, the interconnection layers 11, the through vias 12, and the solder resist layers 14 are formed on the interconnection board 10. Next, using a mask material M1 formed on one solder resist layer 14, the openings OP are formed in the solder resist layer 14. At this time, each opening OP is formed in such a manner as to expose the interconnection layer 11 and the insulating layer 15 around the interconnection layer 11.

Figure 10:
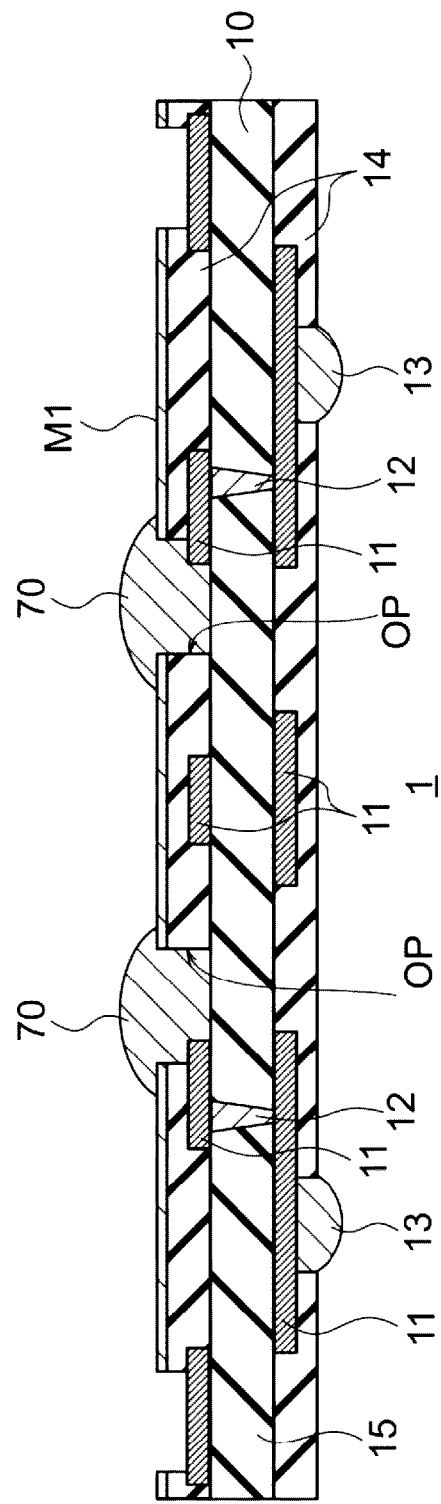

Next, although not shown, a flux is applied to remove an oxide film on a front surface of the interconnection layer 11 exposed in each opening OP. Next, a heat treatment is performed on the interconnection board 10 to subject the interconnection board 10 to a plasma treatment. Next, as shown in FIG. 10, the liquid or paste metal material 70 is supplied to the front surface of the interconnection board and each opening OP. The interconnection layer 11 exposed in the opening OP is covered with the liquid or paste metal material 70.

Figure 11:
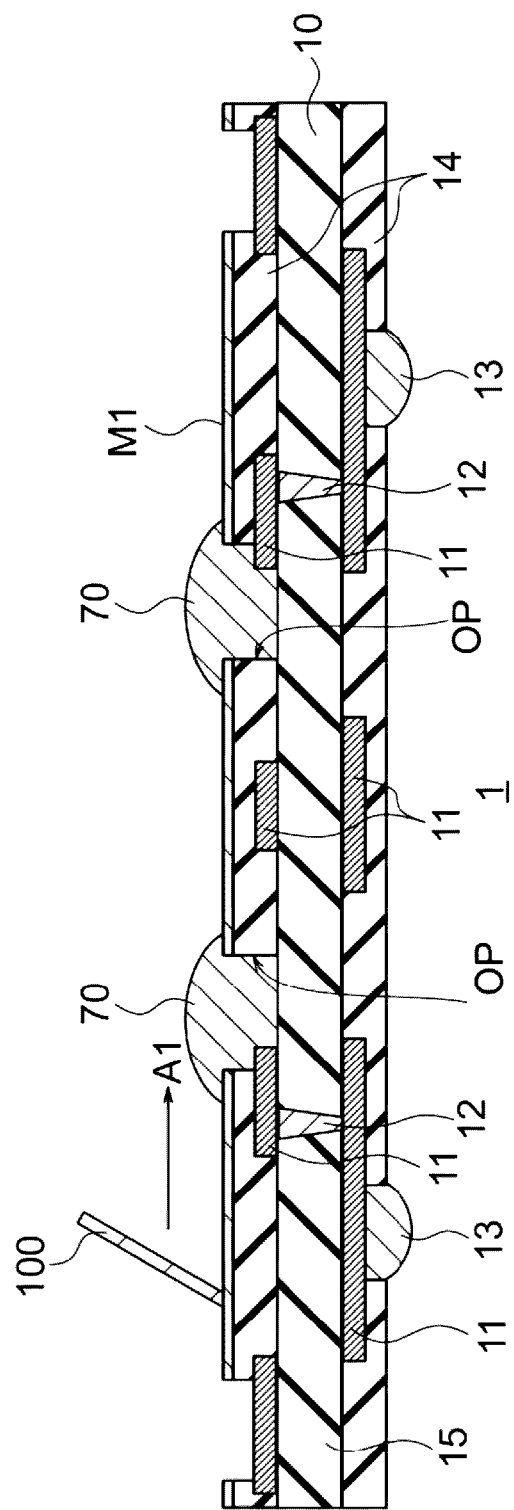
Figure 12:
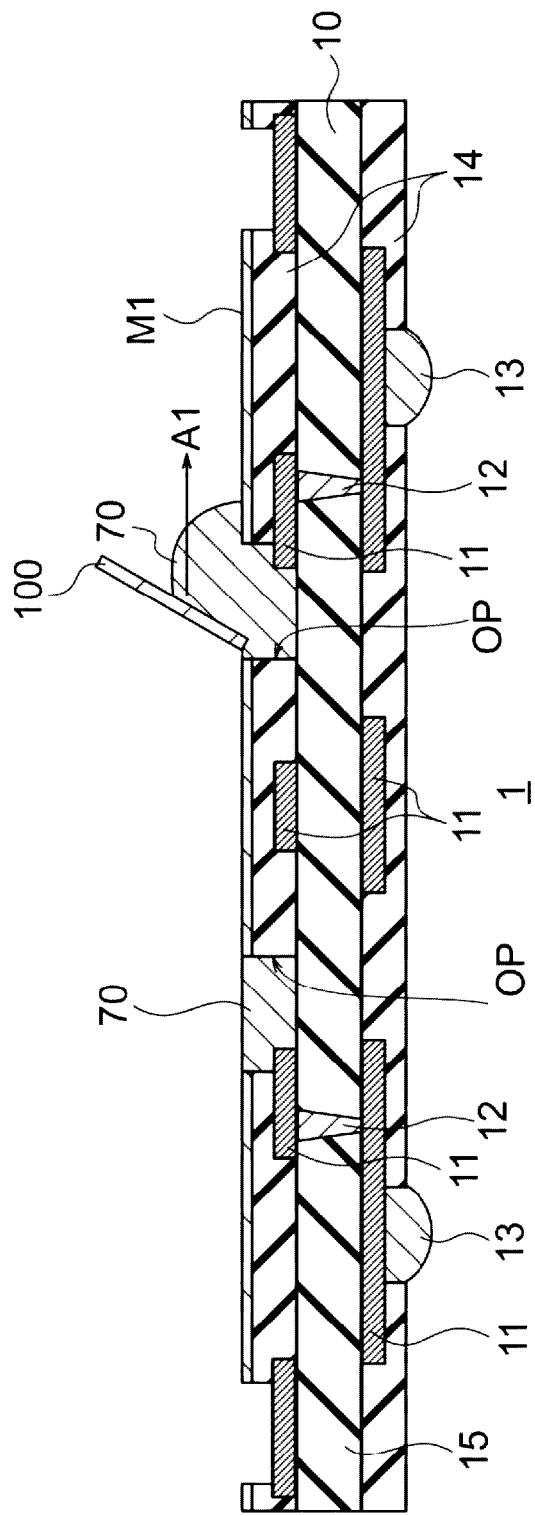
Figure 13:
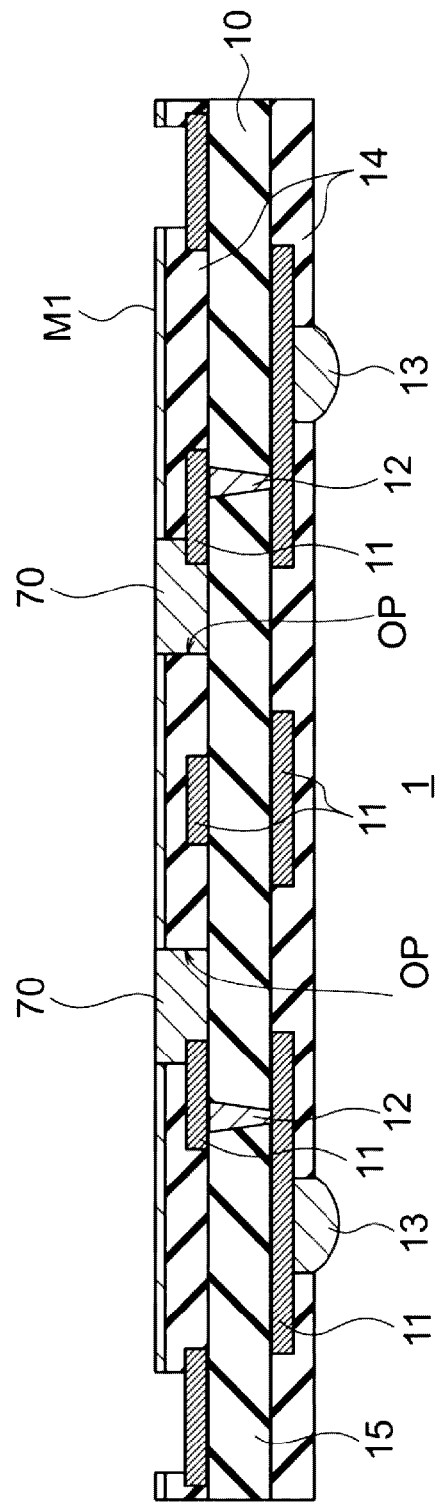

Next, as shown in FIG. 11, a squeegee-like tool 100 is used to scrape a front surface of the mask material M1 on the interconnection board 10. The tool 100 may be, for example, a plate-like scraper formed from a resin, a metal, or the like. By causing the tool 100 to scrape along the interconnection board 10 in an A1 direction, excessive liquid or paste metal material 70 can be removed from the interconnection board 10 while filling the metal material into each opening OP, as shown in FIG. 12. The A1 direction is generally parallel to the front surface of the interconnection board 10. That is, the squeegee-like tool 100 leaves the metal material 70 within the opening OP but wipes off the excessive metal material 70 from the interconnection board 10 to remove the metal material 70 from the interconnection board 10 while scraping the interconnection board 10 in the A1 direction. As shown in FIG. 13, the metal material 70 is thereby filled/pushed into the opening OP. The metal material 70 hardly remains on the mask material M1. Furthermore, even when the metal material 70 remains on the mask material M1, the metal material 70 can be removed from the solder resist layer 14 by removing the mask material M1. It is noted that the metal material 70 may be subjected to reflow to fill the metal material 70 into the opening OP more reliably.

Figure 14:
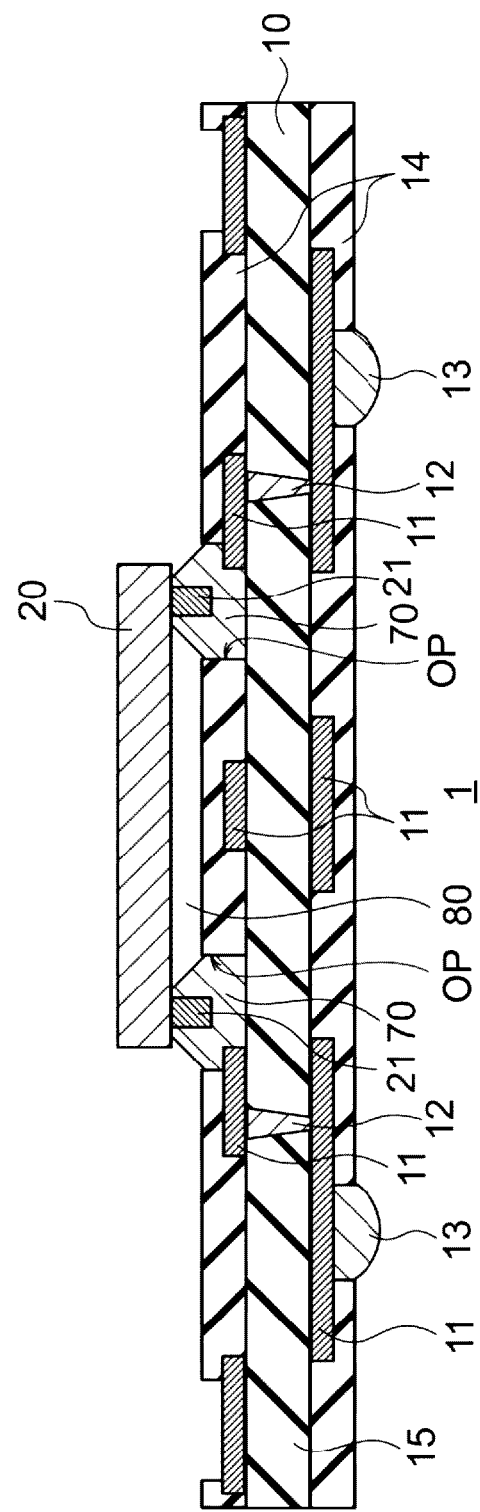

Next, each semiconductor chip 20 formed in the process shown in FIG. 9 is picked up and each electrode pillar 21 of the semiconductor chip 20 is inserted into the metal material 70 within each opening OP, as shown in FIG. 14. At this time, when coming into contact with the lower end portion 21b of the electrode pillar 21, the liquid or paste metal material 70 is brought up from the lower end portion 21b along the side surface of the electrode pillar 21. Therefore, the metal material 70 is formed to be tapered obliquely upward from an upper end of the opening OP to the side surface of the electrode pillar 21. The metal material 70 thereby bulges from the opening OP along the side surface of the electrode pillar 21. The metal material 70 bulges from the opening OP along the side surface of the electrode pillar 21 by as much as the volume equal to or greater than the volume of the electrode pillar 21 inserted into the opening OP. The bulge of the metal material 70 from the opening OP in such a manner as to be in contact with the side surface of the electrode pillar 21 enables the reduction in the contact resistance between the metal material 70 and the electrode pillar 21.

It is noted that the lower end portion 21b of the electrode pillar 21 may be located at any position lower than the upper surface 14a of the solder resist layer 14. That is, the lower end portion 21b of the electrode pillar 21 may be inserted to be lower than the upper surface 11a of the interconnection layer 11, or inserted only down to a position higher than the upper surface 11a of the interconnection layer 11. This is because the electrode pillar 21 can be electrically connected to the interconnection layer 11 via the metal material 70 without direct contact with the interconnection layer 11.

Furthermore, as described with reference to FIG. 3, the interconnection layer 11 is not present immediately under each electrode pillar 21. Therefore, in the view from the mounting direction of the semiconductor chip 20, each electrode pillar 21 is apart from the interconnection layer 11, and the metal material 70 is interposed between the electrode pillar 21 and the interconnection layer 11. In this way, even without the interconnection layer 11 provided immediately under the electrode pillar 21, the electrode pillar 21 can be electrically connected to the interconnection layer 11 via the metal material 70.

The lower end portion 21b of the electrode pillar 21 may be in contact with the upper surface 15a of the insulating layer 15. The semiconductor chip 20 can be thereby made closer to the interconnection board 10, so that the package of the semiconductor device 1 can be made thinner.

Next, the interconnection board 10 is baked to volatilize a solvent of the liquid or paste metal material 70. Each electrode pillar 21 is connected to the metal material 70 by metallic diffusion. When baking is over, the metal material 70 is more cured than that before baking. A position of the semiconductor chip 20 with respect to the interconnection board 10 is thereby nearly fixed.

Figure 15:
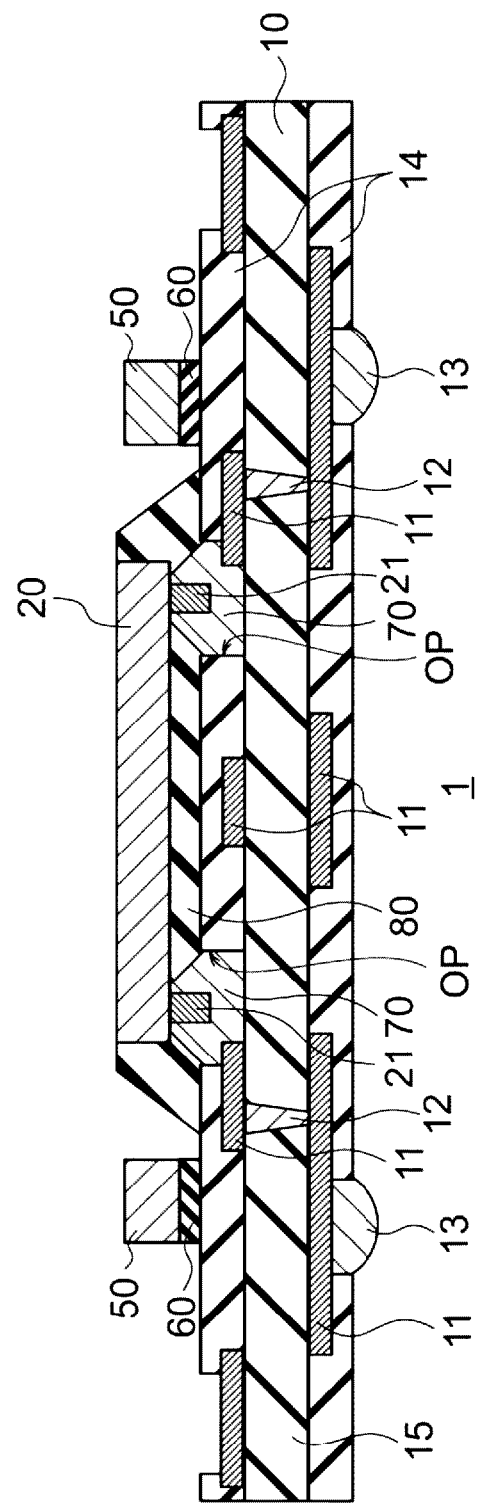

Next, as shown in FIG. 15, the resin layer 80 is supplied to the semiconductor chip 20. The resin layer 80 is, for example, an underfill material. The resin layer 80 penetrates between the semiconductor chip 20 and the interconnection board 10 and covers surroundings of the metal material 70 and a side surface of the semiconductor chip 20.

Next, the spacer chips 50 are adhesively bonded onto the interconnection board 10 around the semiconductor chip 20 via the adhesive layers 60. It is preferable that a height of an upper surface of each spacer chip 50 is generally equal to a height of an upper surface of the semiconductor chip 20. This can improve flatness of the semiconductor chips 30 to 33 to be stacked on the semiconductor chip 20.

Subsequently, as shown in FIG. 1, the semiconductor chip 30 having the adhesive layer 40 bonded onto a rear surface of the semiconductor chip 30 is mounted onto the semiconductor chip 20, the semiconductor chip 31 having the adhesive layer 41 bonded onto a rear surface of the semiconductor chip 31 is mounted onto the semiconductor chip 30, the semiconductor chip 32 having the adhesive layer 42 bonded onto a rear surface of the semiconductor chip 32 is mounted onto the semiconductor chip 31, and the semiconductor chip 33 having the adhesive layer 43 bonded onto a rear surface of the semiconductor chip 33 is mounted onto the semiconductor chip 32.

Next, the bonding wire 90 is disposed to connect the pads of the semiconductor chips 30 to 33 to the pads on the interconnection board 10. Furthermore, the encapsulation resin 91 encapsulates the semiconductor chips 20 and 30 to 33, the bonding wire 90, and the like, thus forming the structure shown in FIG. 1.

As described so far, the liquid or paste metal material (for example, solder paste) 70 is supplied onto the interconnection board 10 and then wiped off by the tool 100. The metal material 70 is thereby filled into each opening OP. Each electrode pillar 21 of the semiconductor chip 20 is then inserted into the metal material 70 within the opening OP.

When a solder bump is formed on each electrode pillar in advance and this solder bump is connected to the interconnection board 10 by flip-chip bonding, the flip-chip bonding is performed while supplying a flux to the connection portion in order to remove an oxide film on a front surface of the bump. At this time, a flow of the flux causes generation of inclusion voids within each opening OP and around each electrode pillar 21.

By contrast, each electrode pillar 21 is inserted into the metal material (e.g., solder) 70 that is filled into each opening OP in advance. Owing to this, at a time of flip-chip bonding, the opening OP is already filled with the metal material 70 and voids are not formed within the opening OP or around the electrode pillar 21. Furthermore, it is unnecessary to attach the solder bump to the electrode pillar 21 in advance and unnecessary to supply the flux at the time of flip-chip bonding. It is, therefore, possible to prevent the generation of inclusion voids within the opening OP and around the electrode pillar 21.

Second Embodiment

Figure 16:
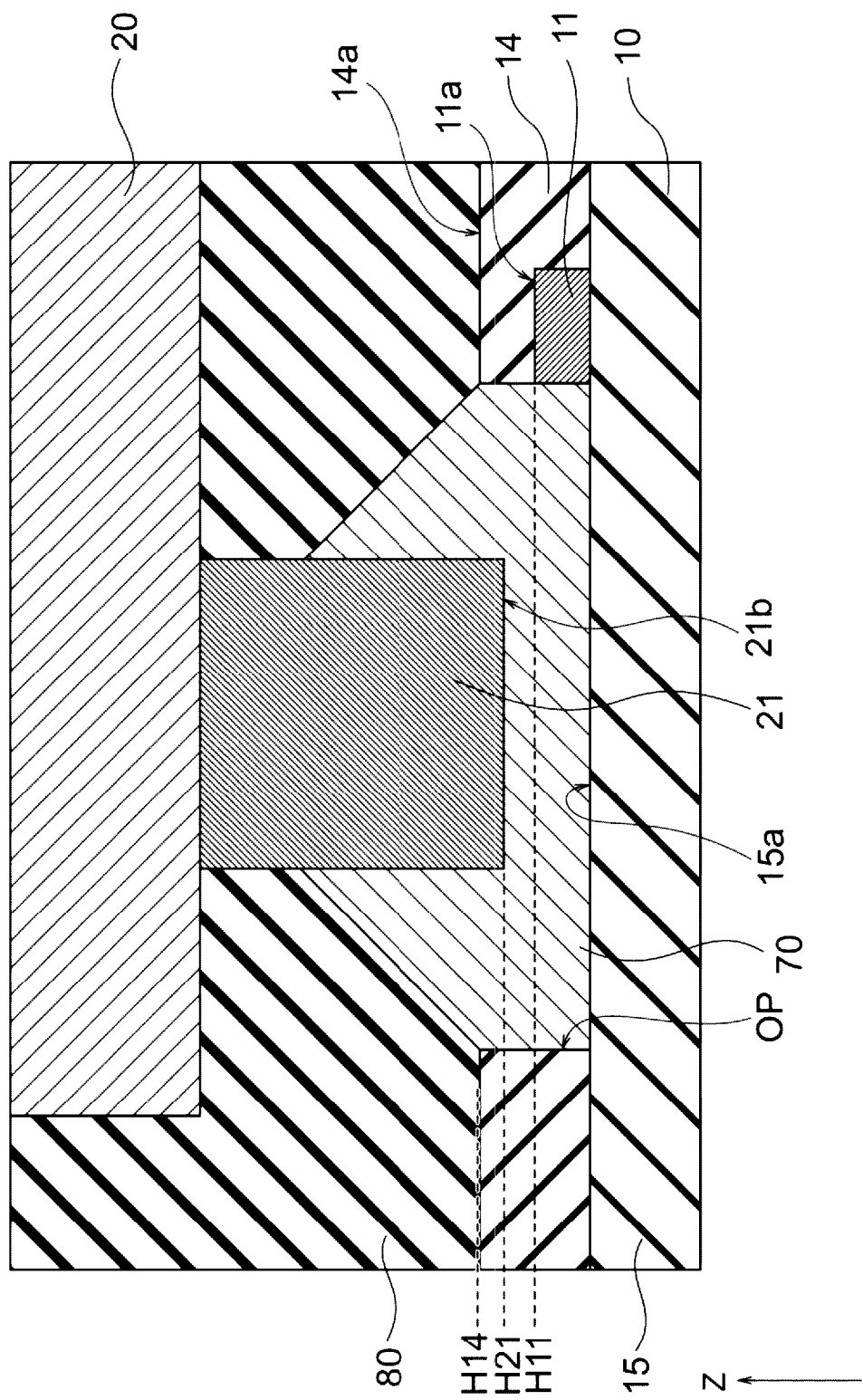
FIG. 16 is an enlarged cross-sectional view of a connection portion between a semiconductor chip and an interconnection board according to a second embodiment.
Figure 17:
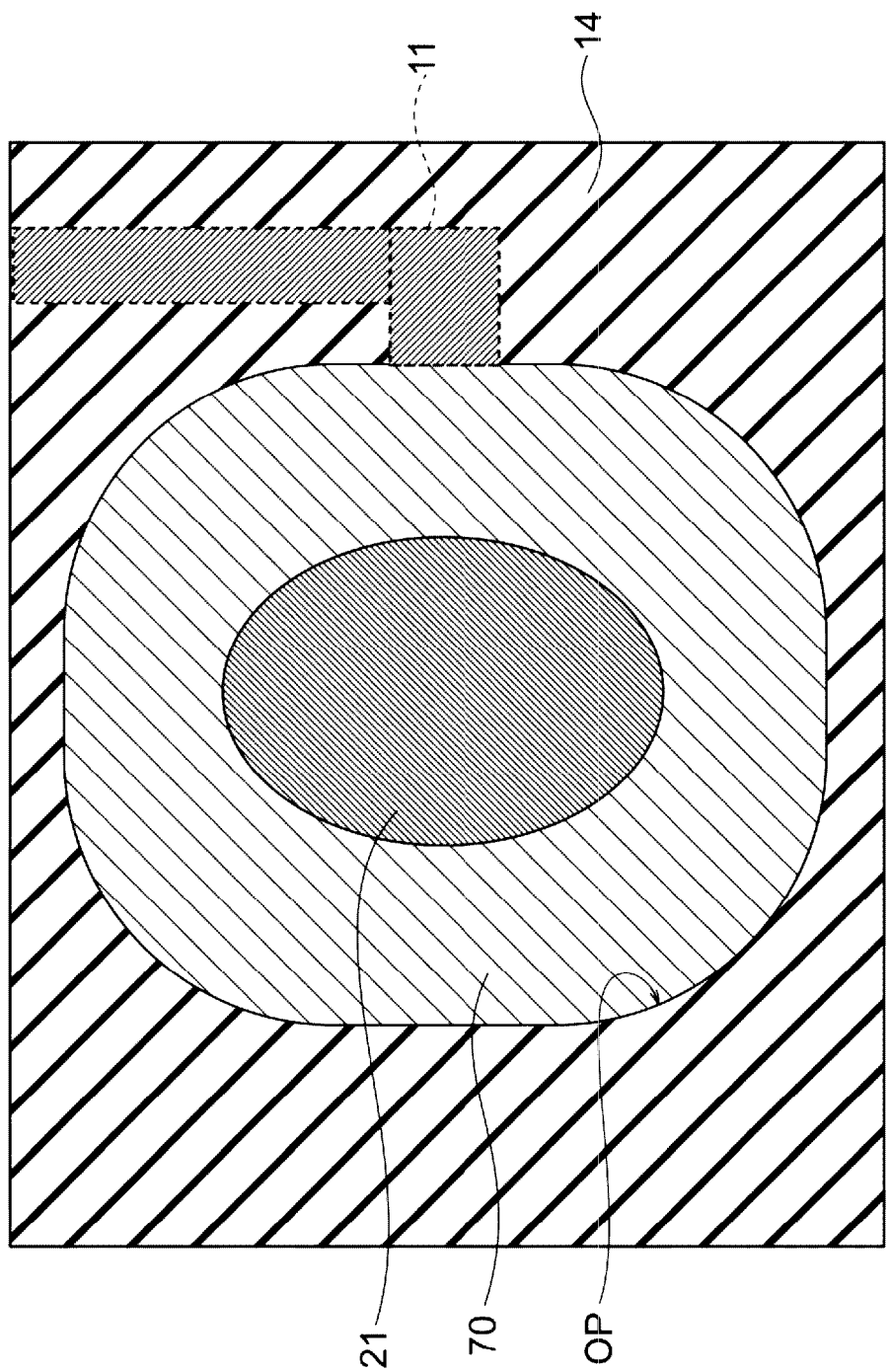
FIG. 17 is a plan view showing a positional relationship among a solder resist layer, an opening, an interconnection layer, and an electrode pillar according to a second embodiment.

FIG. 16 is an enlarged cross-sectional view of an example of configurations of the connection portion between the semiconductor chip 20 and an interconnection board 10 according to a second embodiment. FIG. 17 is a plan view showing a positional relationship among the solder resist layer 14, the opening OP, the interconnection layer 11, and the electrode pillar 21 according to the second embodiment. In the second embodiment, part of the interconnection layer 11 faces on an inner surface of each opening OP and exposed on the inner surface. That is, as shown in FIG. 16, the interconnection layer 11 does not project toward the opening OP and only faces on the opening OP. Even with such a configuration, the metal material 70 can similarly contact with the interconnection layer 11 and electrically connect each electrode pillar 21 to the interconnection layer 11.

Other configurations in the second embodiment may be similar to the corresponding configurations in the first embodiment. The second embodiment can, therefore, attain similar advantages to those of the first embodiment.

Third Embodiment

Figure 18:
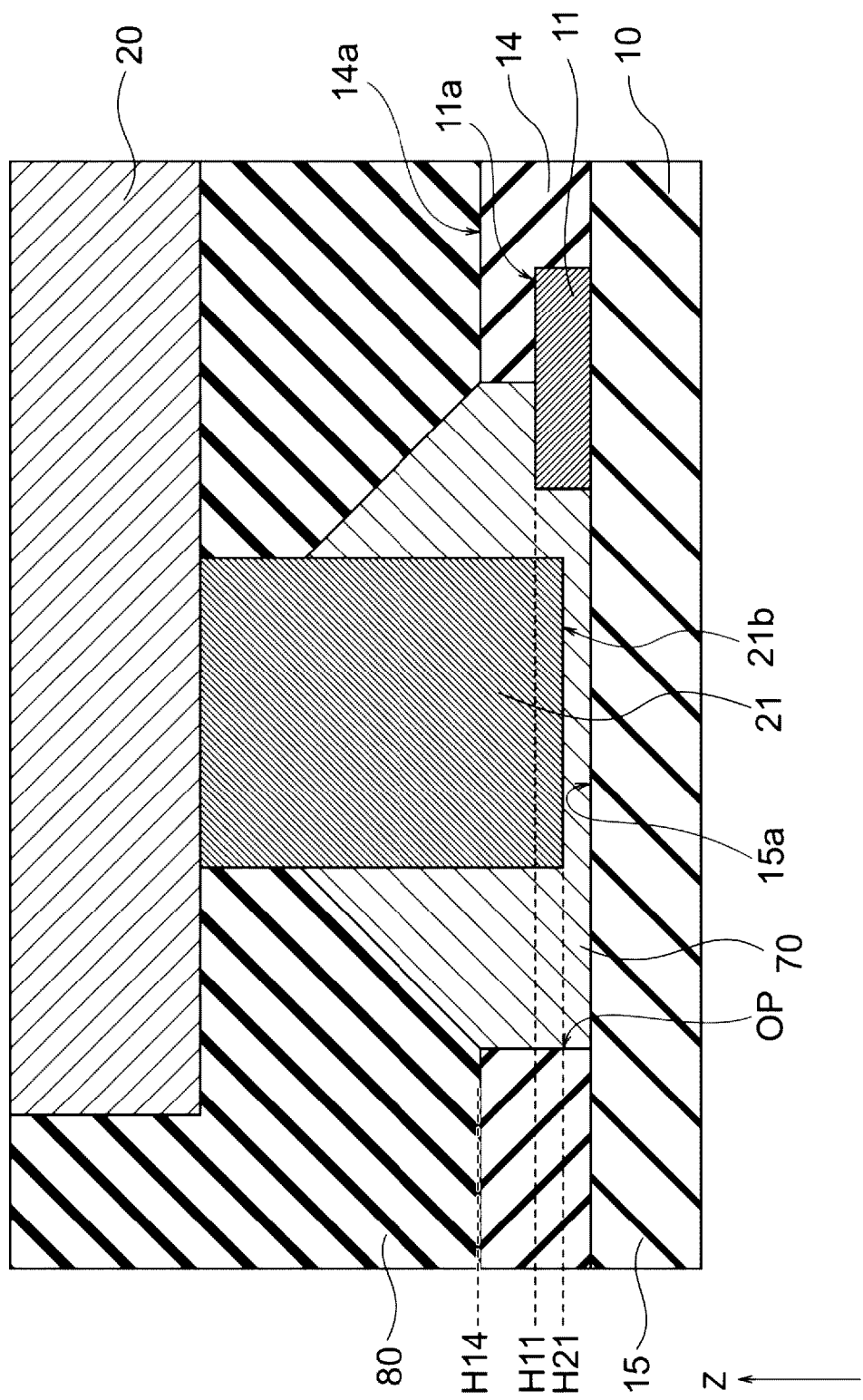
FIG. 18 is an enlarged cross-sectional view of a connection portion between a semiconductor chip and an interconnection board according to a third embodiment.

FIG. 18 is an enlarged cross-sectional view of the connection portion between the semiconductor chip 20 and the interconnection board 10 according to a third embodiment. According to the third embodiment, the height H21 of the lower end portion 21b of each electrode pillar 21 from the upper surface 15 of the insulating layer 15 is smaller than the height H11 of the interconnection layer 11. This enables the metal material 70 to contact with the side surface of the electrode pillar 21 by a relatively large area. Therefore, the contact resistance between the metal material 70 and the electrode pillar 21 can be further reduced. Other configurations in the third embodiment may be similar to the corresponding configurations in the first embodiment. The third embodiment can thereby attain similar advantages to those of the first embodiment. Furthermore, the third embodiment may be combined with the second embodiment.

Fourth Embodiment

Figure 19:
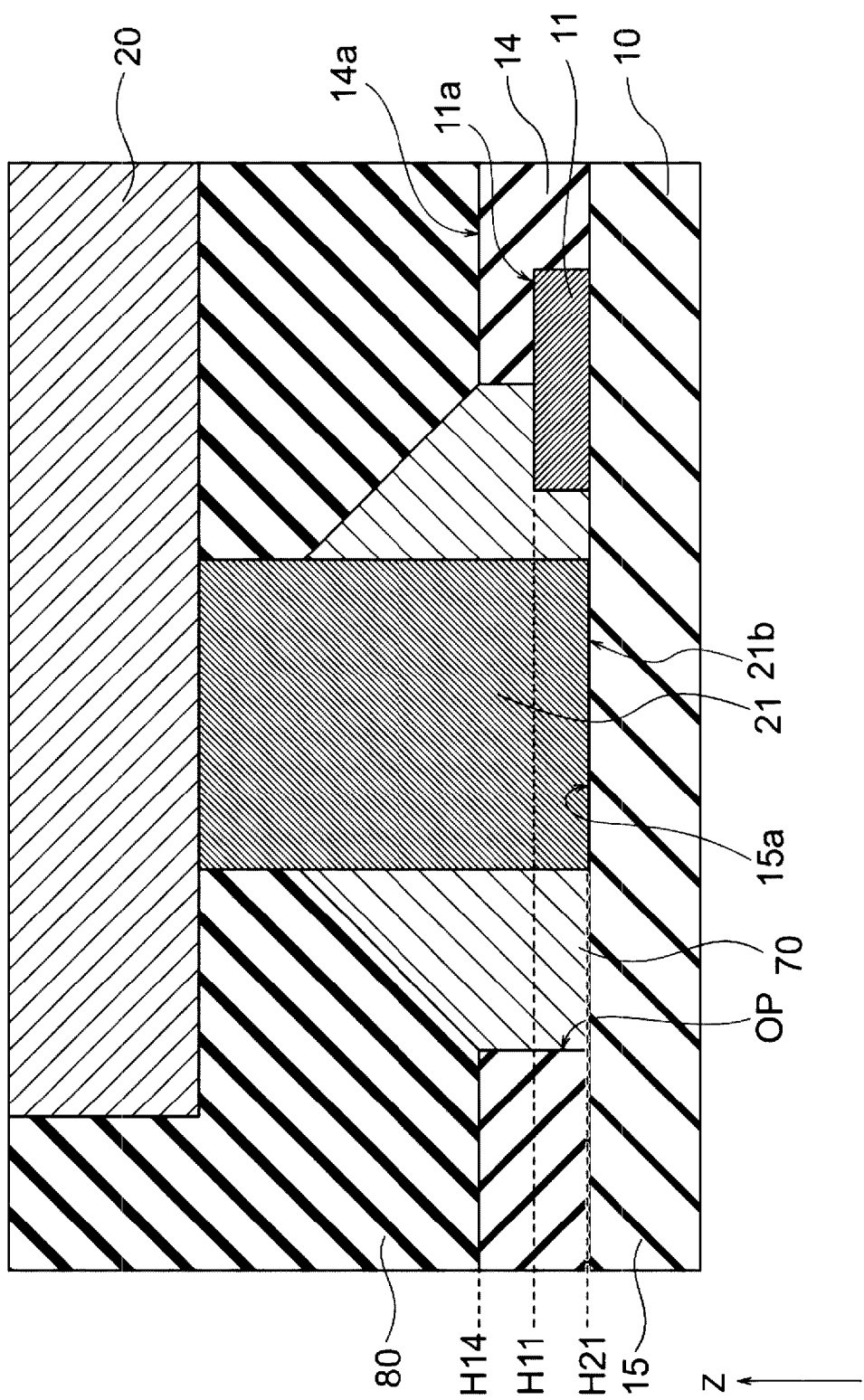
FIG. 19 is an enlarged cross-sectional view of a connection portion between a semiconductor chip and an interconnection board according to a fourth embodiment.

FIG. 19 is an enlarged cross-sectional view of the connection portion between the semiconductor chip 20 and the interconnection board 10 according to a fourth embodiment. According to the fourth embodiment, the lower end portion 21b of each electrode pillar 21 is in contact with the upper surface 15a of the insulating layer (e.g., prepreg) 15. That is, the height H21 of the lower end portion 21b is substantially equal to a height of the upper surface 15a of the insulating layer 15 of the interconnection board 10. This enables the metal material 70 to contact with the side surface of the electrode pillar 21 by a larger area. Therefore, the contact resistance between the metal material 70 and the electrode pillar 21 can be further reduced. Other configurations in the fourth embodiment may be similar to the corresponding configurations in the first embodiment. The fourth embodiment can, therefore, attain similar advantages to those of the first embodiment. Furthermore, the fourth embodiment may be combined with the second embodiment.

Fifth Embodiment

In the first to fourth embodiments, the resin layer 80 is supplied after connection of the semiconductor chip 20 to the interconnection board 10, as shown in FIGS. 13 to 15. However, in a fifth embodiment, after providing the metal material 70 on the interconnection board 10, an NCP (Non-Conductive Paste) is supplied as the resin layer 80 to the interconnection board 10. The semiconductor chip 20 and the interconnection board 10 are then connected to each other by heating and pressing. At this time, the NCP between the interconnection board 10 and the semiconductor chip 20 flows by heating and pressing and leaks from between the interconnection board 10 and the semiconductor chip 20. The leaking NCP draws up along the side surface of the semiconductor chip 20. In view of this, in the fifth embodiment, the semiconductor chip 20, the interconnection board 10, and the resin layer 80 are provided in a manner shown in FIG. 1.

Thus, it is possible to attain similar advantages to those of the first to fourth embodiments.

Sixth Embodiment

In a sixth embodiment, a connection method using an NCF (Non-Conductive Film) as an alternative to the NCP is applied. The metal material 70 is provided on the interconnection board 10. The NCF is provided, as the resin layer 80, on the surface of the semiconductor chip 20 on which each electrode pillar 21 is provided. The semiconductor chip 20 and the interconnection board 10 are then connected to each other by heating and pressing. At this time, the NCF between the interconnection board 10 and the semiconductor chip 20 flows by heating and pressing and leaks from between the interconnection board 10 and the semiconductor chip 20. The leaking NCF material is drawn up along the side surface of the semiconductor chip 20. Therefore, in the sixth embodiment, the semiconductor chip 20, the interconnection board 10, and the resin layer 80 are provided in the manner shown in FIG. 1.

Therefore, it is possible to attain similar advantages to those of the first to fifth embodiments.

Additional Example Embodiments

In the embodiments described above, the metal material 70 is provided within each opening OP of the interconnection board 10 by using the squeegee-like tool 100. Alternatively, the metal material 70 may be provided within the opening OP by various other methods including screen printing, use of an automated dispenser, and inkjet method. Even in these other cases, it is possible to attain similar advantages to those in the embodiments described above.

In the embodiments described above, each electrode pillar 21 may be inserted into the metal material 70 within each opening OP while heating the semiconductor chip 20 or the interconnection board 10. Even in this case, it is possible to attain similar advantages to those in the embodiments described above.

In the embodiments described above, a conductive resin or the like (such as, poly (3,4-ethylenedioxythiophene): poly(styrene sulfonate) (PEDOT:PSS)) may be used as an alternative to the metal material 70. Even in this case, it is possible to attain similar advantages to those in the embodiments described above. Furthermore, any material may be used as an alternative to the metal material 70 as long as the material is a conductive material.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device, comprising:
a substrate that includes:
 a first insulating layer,
 a conductive layer on the first insulating layer,
 a second insulating layer on the conductive layer, and
 an opening that passes through the conductive layer and the second insulating layer and in which part of the conductive layer is exposed;
a conductive material that contacts at least the first insulating layer and the part of the conductive layer in the opening; and
a semiconductor chip that has an electrode extending towards the first insulating layer within the opening and contacting the conductive material, wherein
a lower end of the electrode is closer to the first insulating layer than an upper surface of the conductive layer.

2. The semiconductor device according to claim 1, wherein the lower end of the electrode is spaced apart from the first insulating layer.

3. The semiconductor device according to claim 2, wherein the conductive material is between the lower end of the electrode and the first insulating layer.

4. A semiconductor device, comprising:
a substrate that includes:
  a first insulating layer,
  a conductive layer on the first insulating layer,
  a second insulating layer on the conductive layer, and
  an opening that passes through the conductive layer and the second insulating layer and in which part of the conductive layer is exposed;
a conductive material that contacts at least the first insulating layer and the part of the conductive layer in the opening; and
a semiconductor chip that has an electrode extending towards the first insulating layer within the opening and contacting the conductive material, wherein
an upper surface of the conductive layer is closer to the first insulating layer than a lower end of the electrode.

5. The semiconductor device according to claim 1, wherein the part of the conductive layer projects from an inner surface of the opening that passes through the second insulating layer toward a center of the opening.

6. The semiconductor device according claim 1, wherein the part of the conductive layer forms part of an inner surface of the opening.

7. The semiconductor device according to claim 1, wherein the conductive material is further provided along a side surface of the electrode above the opening.

8. The semiconductor device according to claim 7, wherein a volume of the conductive material above the opening is greater than or equal to a volume of the electrode in the opening.

9. A semiconductor device, comprising:
a substrate that includes:
  a first insulating layer,
  a conductive layer on the first insulating layer,
  a second insulating layer on the conductive layer, and
  an opening that passes through the conductive layer and the second insulating layer and in which part of the conductive layer is exposed;
a conductive material that contacts at least the first insulating layer and the part of the conductive layer in the opening; and
a semiconductor chip that has an electrode extending towards the first insulating layer within the opening and contacting the conductive material, wherein
the electrode contacts the first insulating layer.

10. The semiconductor device according to claim 4, wherein the lower end of the electrode is spaced apart from the first insulating layer.

11. The semiconductor device according to claim 10, wherein the conductive material is between the lower end of the electrode and the first insulating layer.

12. The semiconductor device according to claim 4, wherein the part of the conductive layer projects from an inner surface of the opening that passes through the second insulating layer toward a center of the opening.

13. The semiconductor device according claim 4, wherein the part of the conductive layer forms part of an inner surface of the opening.

14. The semiconductor device according to claim 4, wherein the conductive material is further provided along a side surface of the electrode above the opening.

15. The semiconductor device according to claim 14, wherein a volume of the conductive material above the opening is greater than or equal to a volume of the electrode in the opening.

16. The semiconductor device according to claim 9, wherein the part of the conductive layer projects from an inner surface of the opening that passes through the second insulating layer toward a center of the opening.

17. The semiconductor device according claim 9, wherein the part of the conductive layer forms part of an inner surface of the opening.

18. The semiconductor device according to claim 9, wherein the conductive material is further provided along a side surface of the electrode above the opening.

19. The semiconductor device according to claim 18, wherein a volume of the conductive material above the opening is greater than or equal to a volume of the electrode in the opening.

* * * * *